United States Patent [19]

Wollesen et al.

[11] 4,306,916
[45] Dec. 22, 1981

[54] CMOS P-WELL SELECTIVE IMPLANT METHOD

[75] Inventors: Donald L. Wollesen, Saratoga; William Meuli, Sunnyvale; Philip S. Shiota, Saratoga, all of Calif.

[73] Assignee: American Microsystems, Inc., Santa Clara, Calif.

[21] Appl. No.: 77,383

[22] Filed: Sep. 20, 1979

[51] Int. Cl.³ .................... H01L 7/54; H01L 21/265; B01J 17/00

[52] U.S. Cl. .................................. 148/1.5; 29/571; 29/576 B; 148/187; 357/23; 357/42; 357/91

[58] Field of Search .................. 148/1.5, 187; 357/23, 357/42, 91; 29/571, 576 B

[56] References Cited

U.S. PATENT DOCUMENTS

| | | | |
|---|---|---|---|
| 4,013,484 | 3/1977 | Boleky | 148/1.5 |
| 4,045,250 | 8/1977 | Dingwall | 148/1.5 |
| 4,081,896 | 4/1978 | Dingwall | 29/590 |
| 4,084,311 | 4/1978 | Yasuoka et al. | 29/571 |
| 4,104,784 | 8/1978 | Klein | 29/571 |
| 4,139,402 | 2/1979 | Steinmaier et al. | 148/188 |
| 4,217,149 | 8/1980 | Sawazaki | 148/1.5 |

*Primary Examiner*—Upendra Roy
*Attorney, Agent, or Firm*—Skjerven, Morrill, Jensen, MacPherson & Drucker

[57] ABSTRACT

A method for fabricating a complementary metal-oxide-silicon (CMOS) integrated circuit device by forming a composite layer of oxide and nitride on the surface of a silicon substrate defined into predetermined areas for the subsequent formation of transistors, masking the substrate to expose preselected areas for P-wells, ion implanting P-type material in the exposed areas to form P-wells so that a relatively high doping level is provided to a greater depth around composite areas within the P-wells areas and a relatively lower doping level is established under the composite layer areas with the P-wells. The ion implantation of P-type material may be accomplished in either a single stage or a two stage procedure.

10 Claims, 9 Drawing Figures

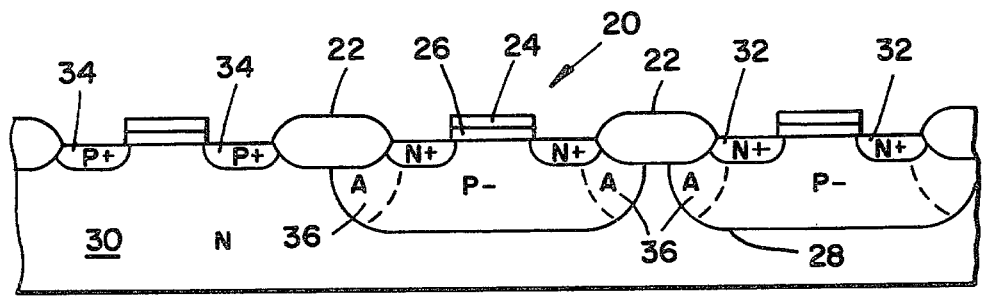
FIG_1 (PRIOR ART)
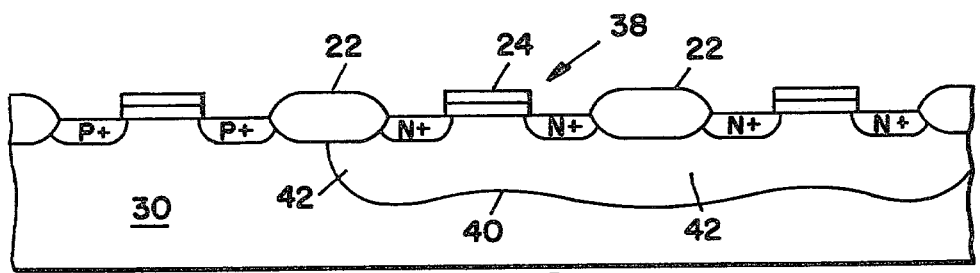
FIG_2
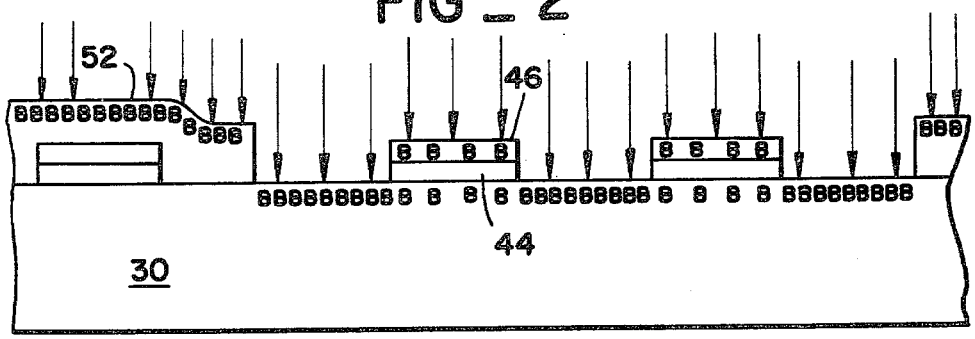
FIG_3
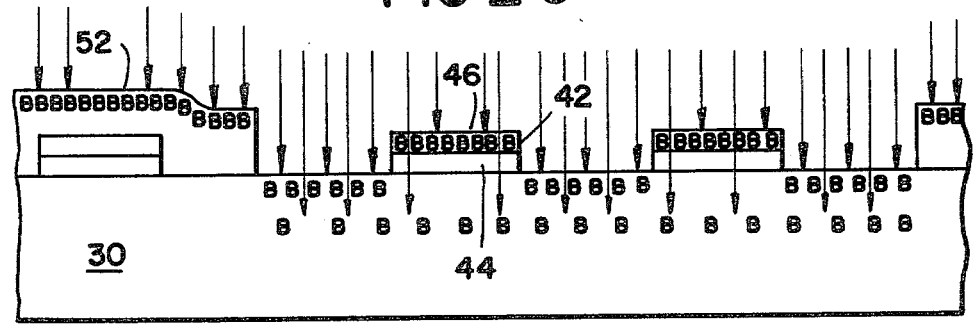
FIG_4

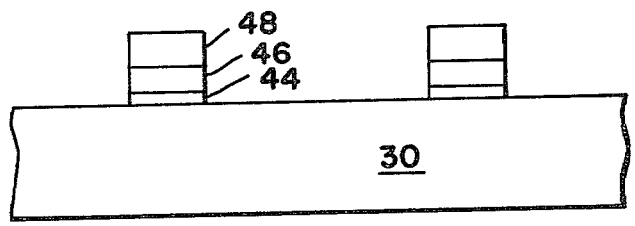
FIG_5
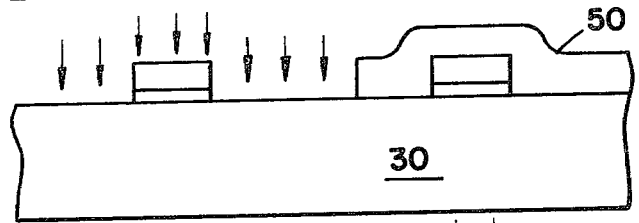
FIG_6
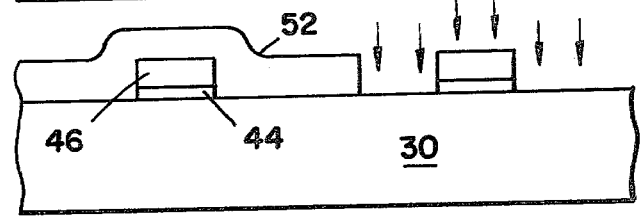
FIG_7
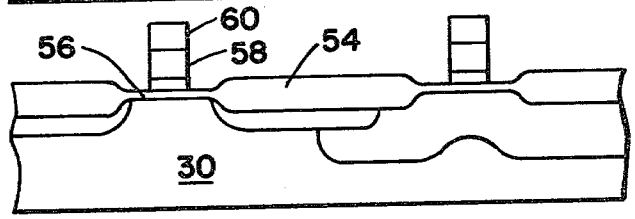
FIG_8
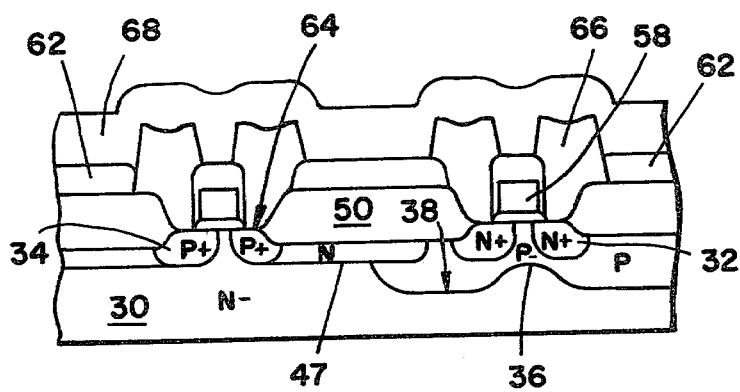
FIG_9

CMOS P-WELL SELECTIVE IMPLANT METHOD

BACKGROUND OF THE INVENTION

This invention relates generally to semiconductor devices of the metal-oxide-silicon (MOS) type and to the production or fabrication of integrated circuits containing arrays of such devices. More particularly, the present invention relates to an improved method for fabricating complementary or CMOS type integrated circuits.

In conventional CMOS devices which use opposite polarity transistors to perform circuit functions, an important step in the fabrication process is the formation of lightly-doped areas of P-type diffusion, or "P-wells", within which the N-channel transistors are formed. These relatively deep P-well diffusions are normally formed at a low doping level and require extreme precision since the dopant concentration regulates both the threshold voltage $V_T$ and the breakdown voltage of the N-channel MOSFET's. The formation of the P-wells is further complicated by the fact that in any integrated circuit array, parasitic transistors are created by conductive interconnect lines that extend over the field oxide areas. If the field oxide is thin enough to allow inversion, parasitic leakage can occur that could cause the circuit to malfunction or use excessive power. To overcome this problem, it was heretofore necessary to increase the field oxide thickness in the field area to several times the oxide thickness in the device area. For example, in prior art CMOS circuits, the field oxide to device oxide ratio was often required to be 15 to 1 or greater. A serious disadvantage with this requirement for a relatively thick field oxide was that it created large oxide step heights and limited the use of fine line geometries in CMOS integrated circuits.

In addition to the aforesaid requirement for a relatively thick field oxide and the inherent "step" problems, a further disadvantage with prior CMOS integrated circuits was that they also required "channel stop" diffusions to provide isolation and prevent leakage between transistor cells. Although such channel stops did not require extra processing steps, they did require extra area and thus substantially increased the size of the integrated circuit chip.

The present invention, as described herein, solves both of these problems with a fabrication process using field implants which removes the requirement for channel stops and also allows a thinner field oxide layer to be used. This improvement provides better thin film step coverage and easier, more efficient photolithography which in turn allows fine line widths and small spaces in the overall circuit topography, thereby making possible a smaller chip size for the circuit.

Yet another problem encountered with prior methods for fabricating CMOS devices with isolated P-wells was that a reduction of doping concentration inherently occurred at the edges of the P-wells under the field oxide at the exact location where the dopant was most needed. This doping reduction occurred because of the typical diffusion distribution which normally causes less dopant at the edges of a diffusion area and also the fact that field oxide has a tendency to deplete dopant at the silicon/oxide interface. Also, in prior CMOS processes, P-wells were formed by ion implantation using field oxide regions already formed as the implant barriers. This often resulted in an array having adjacent P-wells which were isolated from each other unless located closely together, an arrangement that required more topside contacts and therefore more chip area. One method previously suggested for alleviating this problem was to increase the P-well sidewall doping by increasing the original P-doping level and thereafter counterdoping with an N-type dopant. However, this approach proved to be unsatisfactory because it degraded majority carrier mobility and increased N+ area capacitance and hence reduced N-channel device performance. These problems are also solved by the prsent invention.

Accordingly, a general object of the invention is to provide an improved method for making CMOS integrated circuit devices that solves the aforesaid problems.

Another object of the invention is to provide a method for fabricating CMOS semiconductor devices that greatly reduces the ratio of field oxide to device oxide thickness and this eliminates relatively large steps for the conductive paths of the device.

Yet another object of the invention is to provide a method for fabricating CMOS semiconductor devices that provides a deeper and more concentrated doping level along the edges of each P-well extending under the edges of adjacent field oxide areas.

Another object of the invention is to provide an improved CMOS structure that provides a relatively small ratio of field oxide to device oxide thickness and thereby enables the use of relatively narrow conductive interconnect lines.

Another object of the invention is to provide an improved CMOS integrated circuit device structure wherein a single P-well diffusion area is utilized for adjacent N-type transistors of two or more CMOS elements.

Another object of the invention is to enable the reduction of field oxide thickness which reduces the height of oxide steps which subsequent thin film layers must traverse.

SUMMARY OF THE INVENTION

The aforesaid objects of the present invention are accomplished by a method for forming a CMOS integrated circuit wherein P-wells for the N-channel transistors of the circuit are formed prior to the growth of field oxide. Preliminary steps in the present method are similar to conventional procedures for preparing the appropriate silicon material for processing. Thereafter, a first relatively thin oxide is formed on the silicon surface and is then covered with a similar layer of silicon nitride. This composite oxide/nitride barrier layer is then masked and portions are etched away to leave only those areas where field oxide will subsequently be applied.

A second mask of photoresist material is now applied to define the P-well areas by covering some of the oxide/nitride areas and leaving others exposed. With the second mask in place, the P-wells are formed by boron ion implantation in the areas not covered by photoresist. When this implantation takes place, which can be done in one or two implantation steps, some of the boron atoms are trapped in the nitride cap of the exposed oxide/nitride areas. Thus, in areas surrounding the exposed oxide/nitride areas, the boron atoms are driven into the silicon substrate to a predetermined depth and at the prescribed doping level but directly under the exposed oxide/nitride areas, the doping reaches a lesser depth and intensity or level. Following implantation, the P-well implant is driven in by thermal diffusion which may be done prior to or during field oxide growth. Thereafter, in the areas not covered by the oxide/nitride layers, the field oxide is grown and subsequent processing is provided in the conventional manner to define the various P-channel and N-channel transistors and to form the necessary interconnect paths.

With CMOS devices completed in accordance with the principles of the present invention, closely adjacent P-wells may be connected together as one diffusion area, thereby reducing the number of surface contacts required. In these P-wells, the P-doping concentration is heavier under the field oxide areas where it is most needed to improve field threshold. The advantages of reduced field oxide thickness requirements which allows finer geometric lines and hence, CMOS circuits with greater device density, are provided with the improved process which has no additional steps.

Other objects, advantages and features of the invention may become apparent from the following detailed description, taken in conjunction with the accompanying drawing.

BRIEF DESCRIPTION OF THE DRAWING

FIG. 1 is a view in section showing a portion of a CMOS device of the prior art with conventional P-wells;

FIG. 2 is a view in section showing a portion of a CMOS device made in accordance with the present invention;

FIG. 3 is a diagrammatic view in section showing the formation of a P-well by ion implantation according to one embodiment of the invention;

FIG. 4 is a diagrammatic view in section showing the formation of a P-well by ion implantation according to a second embodiment of the invention;

FIGS. 5-9 are a series of fragmentary views in section, illustrating the method steps for fabricating a CMOS device according to the principles of the present invention.

DETAILED DESCRIPTION OF THE EMBODIMENT

With reference to the drawing, FIG. 1 shows diagrammatically, a portion of a typical complementary MOS integrated circuit device 20 having conventional selective field oxide areas 22 that are spaced apart to form open areas within which is an MOS transistor gate 24 on its thin layer of gate oxide 26. In such prior art, CMOS devices, lightly-doped "P-well" regions 28 for the N-channel transistors of each complementary device are diffused into the device substrate 30 after the field oxide areas have been defined. The N-channel transistors comprise N-type source and drain diffusions 32 provided later within each P-well, and complementary P-channel transistors are formed in the open areas outside the P-wells by P-type source and drain diffusions 34. The P-well regions 28 are fairly uniform gaussian diffused redistribution regions. However, along the outer edge portions 36 of these diffused P-well regions (defined by the dotted lines) the doping levels are lighter than the rest of the P-well, for two reasons. First, because of conventional diffusion characteristics, there is less dopant source available at this edge location for dopant redistribution. Secondly, field oxide material has a natural tendency to deplete boron dopant at the silicon/oxide interface. Yet, in order to prevent field threshold inversion at lower voltages, the edge areas 36 are where the P-dopant concentration should be relatively high. It is also typical in the prior art, as illustrated in FIG. 1, that where field oxide regions are used as barriers when P-wells are formed by ion implantation, often closely adjacent P-wells are isolated from one another instead of being connected, thereby requiring additional chip area for added surface contacts. Also, in planar CMOS devices of the prior art, channel stop diffusions were required which further increased chip size.

In FIG. 2, a portion of a CMOS integrated circuit device 38, according to the present invention, is shown which overcomes the disadvantages of the device shown in FIG. 1. Here, P-channel and N-channel transistors of the CMOS device are shown located adjacent each other in an N-type substrate material 30. To illustrate a typical CMOS structure similar to the prior art of FIG. 1, but having advantages according to the present invention, another N-channel transistor of another CMOS device is located relatively close to the first N-channel device. Now, in accordance with the invention, the two adjacent N-channel transistors formed by N+ diffusions 32 are both located in the same coextensive P-well 40. Also, this enlarged P-well has edge areas 42 of higher dopant concentration of P-type material located substantially under the above field oxide areas 22 as required, to prevent field threshold inversion at low voltages.

The method steps for accomplishing the improved structure of FIG. 2, according to the present invention, may be best described with reference to FIGS. 5 to 9.

The process commences, as shown in FIG. 5, with a wafer substrate 30 of (typically) N-type silicon <100> crystal plane material which has a (typical) resistivity of 3-5 ohm centimeter. On the surface of the silicon, is grown a relatively thin layer 44 of silicon dioxide (e.g. 300-500 Å) which is called the base oxide. Immediately after this oxide application, a somewhat thicker layer 46 (e.g. 900-2000 Å) of silicon nitride is applied over it. Thereafter, a first mask 48 of photoresist material is used to etch away the composite oxide/nitride layers in all areas except those in which field oxide is to be formed later on.

In the next step of the method, as shown in FIG. 6, P-well areas are defined in the form of a second or reverse P-well mask 50 of photoresist material after the first mask has been removed. With this second mask in place, the unmasked areas are field implanted with an N-type material (e.g. arsenic), preferably by conventional ion implantation procedures, as indicated by the vertical arrows. After this field implant, the photo resist material 50 is removed from the P-well areas. This step of the process is optional depending on desired P-channel field threshold.

For the next step, as shown in FIG. 7, a third mask 52 of photoresist material is applied to cover all areas of the wafer that are not P-well areas. Now, the lightly-doped P-well regions are formed in the substrate 30 by ion implantation. This implantation may be made in a one step single charge procedure or it may be made in a two step or dual charge procedure. In the single energy implantation procedure, a uniform charge energy level (e.g. 50 KEV) may be used with conventional implantation equipment. As illustrated diagrammatically in FIG. 3, a substantial portion of this implantation charge of boron atoms (represented by the letter B) is absorbed by the nitride cap 46 of the composite layer covering the device area, while a percentage of the boron atoms penetrate completely through the composite oxide/nitride layers 44, 46 and into the substrate below as indicated by the spaced apart "B's". However, a full implantation charge of boron atoms (indicated by "B's" closer together) occurs in the open areas surrounding the device areas. Thus, the resulting P-well has a moderate depth of light P-doping in the device area and a higher P dopant concentration around the device area. The photoresist 52 must be thick enough (e.g. 0.5 micron) to absorb this implant for surrounding areas outside the P-well areas.

In an alternate or dual energy implantation procedure, illustrated diagrammatically in FIG. 4, a low-energy/high density charge is first implanted which provides a relatively high dopant level around the device area defined by the unmasked oxide/nitride composite layer. This low energy charge (e.g. 25 KEV) provides a relatively dense concentration (represented by "B's" that are close together) and these low energy boron atoms are completely absorbed by and do not pass through the nitride cap 46 of the composite layer. After completion of the low energy implant, a second implant is made with a relatively high energy (e.g. >100 KEV) and low density charge of boron atoms. This second charge (represented by the "B's" spaced farther apart) forces the P-dopant atoms deeper into the substrate around the device areas and it also penetrates through the composite layer 44, 46 of the device areas to form the P-well thereunder. The photoresist 52 must be thick enough (e.g. 1.0 micron) to absorb both of these implants. The result is essentially the same configuration of P-well as provided by the one charge procedure, that is, P-wells 40 (as shown in FIG. 2) with higher dopant concentration 42 around their peripheries and under field oxide areas than directly under the composite layer or device areas. This method allows a greater degree of process control than the single energy method.

It should be noted that the examples shown herein are silicon gate devices. However, the same technique, according to the invention, could be used for metal gate CMOS processes if desired.

Now, with the P-wells formed as described, the remaining fabrication steps for the CMOS device can proceed. As shown in FIG. 8, a relatively thick oxide layer 54 (e.g. 12,000 Å) is formed in the field areas while a thin oxide layer 56 (e.g. 1,000 Å) is grown in the device areas using conventional procedures. A layer of N+ doped polysilicon 58 is applied to the oxide layer. Thereafter, another mask 60 is used to form the polysilicon gate regions for all of the circuit. When the photoresist layer 60 is removed from the gates 58, the thin oxide around the gates is also etched away.

FIG. 9 shows a portion of the completed CMOS device made according to the method steps of the present invention. The processing steps occurring between FIGS. 8 and 9 are conventional ones, well known to those skilled in the art and therefore, are not shown in detail. Essentially, they involve the formation of the N+ source-drain regions 32 and also, the P+ source-drain regions 34, by standard diffusion techniques; the formation of an intermediate oxide layer 62 which serves as a dielectric layer between polysilicon and metal layers; the formation of contact areas 64 for contact of metal to the various source-drain regions; the metallization 66 in the contact areas; and an upper scratch protection and passivation layer 68 that may be applied in the conventional manner and which may be silicon dioxide, silicon nitride or other passivation material.

With the process of the present invention, the field oxide layer can be kept to a minimum thickness which is substantially thinner than previously required for CMOS devices. This is primarily because the dopant level, being relatively high in the P-well field areas 42, allows a higher field threshold voltage for the device being produced. In other words, a preselected threshold voltage can be obtained by this selective doping process without requiring a relatively thick field oxide layer.

Thus, the CMOS device resulting from the aforesaid method, according to the present invention, with its P-wells 36, formed as previously described, makes possible a relatively low ratio of field oxide to device oxide which eliminates the step problems with conductive paths while providing favorable operating characteristics. Yet the fabrication of such an improved device is accomplished without the necessity for additional masks or complicated processing procedures.

To those skilled in the art to which this invention relates, many changes in construction and widely differing embodiments and applications of the invention, as well as variations in the method steps, will suggest themselves without departing from the spirit and scope of the invention. The disclosures and the description herein are purely illustrative and are not intended to be in any sense limiting.

I claim:

1. In the fabrication of a complementary MOS ("CMOS") integrated circuit device, a method of forming wells of a first conductivity type for transistors having channels of conductivity type opposite said first conductivity type, comprising the steps of:

forming a composite layer of silicon dioxide and silicon nitride on the surface of a silicon substrate;

removing selected portions of said composite layer of silicon dioxide and silicon nitride overlying the field of the to-be-formed MOS integrated circuit device to expose the surface of said silicon substrate, thereby to leave portions of said composite layer of silicon dioxide and silicon nitride over the portions of the surface of said silicon substrate in which will be formed active devices of said to-be-formed MOS integrated circuit device;

forming a layer of masking material over said substrate leaving exposed selected portions of the surface of said substrate and selected ones of said portions of said composite layer overlying said regions of said substrate in which said active devices are to be formed; and ion implanting at a selected energy level a selected dopant of said first conductivity type into said substrate, the ion implantation energy being selected such that no dopant is implanted in said substrate beneath said masking material, dopant is implanted in said substrate beneath said exposed surface to a first concentration level, and dopant is implanted in said portions of said substrate located beneath the portions of said composite layer not covered by said masking material to a second concentration level, said second concentration level being lower than said first concentration level.

2. In the fabrication of a complementary MOS ("CMOS") integrated circuit device in a silicon substrate of a second conductivity type, a method of forming wells of a first conductivity type in said substrate in which are to-be-formed transistors having channels of said second conductivity type, wherein said well has edge areas of higher dopant concentration of said first conductivity type material than the dopant concentration of said first conductivity type material located in the center of the well, thereby to prevent field inversion of the substrate material in the well near the edge of the well, comprising the steps of:

forming a composite layer of silicon dioxide and silicon nitride on the surface of the silicon substrate;

removing portions of said composite layer from said substrate thereby to expose the surface of said substrate and to form said composite layer into a plurality of patterns overlying regions of the substrate in which are to be formed active devices of the to-be-formed CMOS integrated circuit;

forming over the surface of said substrate a masking material;

removing portions of the masking material over portions of the surface of the substrate previously exposed and over selected ones of said plurality of patterns of said composite layer; and implanting ions of selected dopant into said structure, those ions striking said masking material being retained by said masking material thereby to prevent ions from reaching the substrate beneath said masking material; those ions striking the exposed surface of said substrate forming in said substrate to a first concentration, and those ions striking the surface of said device beneath said selected ones of said plurality of patterns of said composite layer forming in the substrate beneath said selected ones of said purality of patterns a dopant concentration less than that of the dopant concentration formed beneath the exposed surface of said substrate.

3. The method of claim 2 wherein the step of forming said composite layer of silicon dioxide and silicon nitride comprises forming a layer of silicon dioxide having a thickness of approximately 300 to 500 angstroms and then forming on said layer of silicon dioxide a layer of silicon nitride having a thickness of 900 to 2,000 angstroms.

4. The method as described in claim 3 wherein said ions have an energy level of approximately 50 KEV.

5. In the fabrication of a complementary MOS ("CMOS") integrated circuit device, a method of forming in a silicon substrate wells of a first conductivity type in which can be formed transistors having channels of conductivity type opposite said first conductivity type, comprising the steps of:

forming a composite layer of silicon dioxide and silicon nitride on the surface of said silicon substrate;

removing selected portions of said composite layer of silicon dioxide and silicon nitride overlying the field of the to-be-formed MOS integrated circuit device, thereby to expose portions of the surface of said silicon substrate and to leave portions of said composite layer of silicon dioxide and silicon nitride over the portions of the surface of said silicon substrate in which will be formed active devices of said to-be-formed MOS integrated circuit device;

forming a layer of masking material over said substrate leaving exposed selected portions of the surface of said substrate and selected ones of said portions of said composite layer overlying said regions of said substrate in which said active devices are to be formed;

ion implanting at a first selected energy level a selected dopant of said first conductivity type into said substrate, the ion implantation energy being selected such that no dopant is implanted in said substrate beneath said masking material, dopant is implanted in the portions of said substrate with the exposed surface to a first concentration level, and no dopant is implanted in said portions of said substrate located beneath the portions of said composite layer not covered by said masking material; and ion implanting at a second selected energy level a selected dopant of said first conductivity type into said substrate, the ion implantation energy being selected such that no dopant is implanted in said substrate beneath said masking material; dopant is implanted in said substrate beneath said exposed surface to a second concentration level, and dopant is implanted in said portions of said substrate located beneath the portions of said composite layer not covered by said masking material to a third concentration level, said second concentration level being substantially equal to said third concentration level, whereby the total concentration level of said dopant in said substrate beneath said exposed surface is greater than the total dopant concentration level in said portions of said substrate located beneath the portions of said composite layer not covered by said masking material.

6. In the fabrication of a complementary MOS ("CMOS") integrated circuit device, a method of forming wells of a first conductivity type suitable for holding transistors having channels of a conductivity type opposite said first conductivity type, wherein the lateral extremities of said well have a higher dopant concentration of said first conductivity type material than the dopant concentration of said first conductivity type material located in the center of the well, thereby to prevent field inversion of the well near the edge of the well, comprising the steps of:

forming a composite layer of silicon dioxide and silicon nitride on the surface of the silicon substrate;

removing portions of said composite layer from said substrate thereby to expose portions of the surface of said substrate and to form said composite layer into a plurality of patterns overlying regions of the substrate in which are to be formed active devices of the to-be-formed MOS integrated circuit;

forming over the surfaces of said substrate and said composite layer a masking material;

removing the masking material over portions of the surface of the substrate previously exposed and over said purality of patterns of said composite layer;

implanting ions of a selected dopant at a first selected energy level into said structure, those ions striking said masking material being retained by said masking material thereby to prevent ions from reaching the substrate beneath said masking material; those ions striking the exposed surface of said substrate forming in said substrate to a first concentration, and those ions striking said purality of patterns of said composite layer being retained by said plurality of patterns of said composite layer thereby to prevent ions from reaching the substrate beneath said plurality of patterns of said composite layer; and implanting ions of a selected dopant at a second selected energy level into said structure, those ions striking said masking material being retained by said masking material thereby to prevent ions from reaching the substrate beneath said masking material; those ions striking the surface of said substrate forming in said substrate to a second concentration, and those ions striking the surface of said plurality of patterns of said composite layer forming a dopant concentration in the substrate beneath said plurality of patterns of said composite layer having a dopant concentration approximately equal to that of the dopant concentration formed beneath the exposed surface of said substrate, whereby the total dopant concentration in the substrate beneath said plurality of patterns of said composite layer is less than the total dopant concentration in the substrate beneath the exposed portions of the surface of said substrate.

7. The method of claim 6 wherein the step of forming said composite layer of silicon dioxide and silicon nitride comprises forming a layer of silicon dioxide having a thickness of approximately 300 to 500 anstroms and then forming a layer of silicon nitride having a thickness of 900 to 2,000 angstroms.

8. The method as described in claim 7 wherein said first selected energy level is approximately 25 KEV and said second selected energy level is within the range of approximately 80 to 100 KEV.

9. The methods as described in claim 6 or 7 wherein said ion implanting at a first selected energy level is of a dopant at a higher density than said ion implanting at a second selected energy level.

10. The method as described in claims 1, 2, 6 or 7 wherein said masking material comprises a photoresist.

* * * * *

UNITED STATES PATENT AND TRADEMARK OFFICE
CERTIFICATE OF CORRECTION

PATENT NO. : 4,306,916

DATED : December 22, 1981

INVENTOR(S) : Donald L. Wollesen, William Meuli, Philip S. Shiota

It is certified that error appears in the above—identified patent and that said Letters Patent is hereby corrected as shown below: On the title page The following reference should be added to the list of references: United States Patent No. 4,244,752 issued to Henderson, Sr., et al, January 13, 1981. (U.S. Class 148/1.5)

In the specification, the following corrections should be made:

Column 2, line 11, cancel "prsent" and insert --present--;

Column 4, line 52, cancel "photo resist" and insert --photoresist--;

In the claims, the following corrections should be made:

Claim 2, Column 7, line 15, cancel "to be formed" and insert --to-be-formed--;

Claim 2, Column 7, line 33, cancel "purality" and insert --plurality--;

UNITED STATES PATENT AND TRADEMARK OFFICE
CERTIFICATE OF CORRECTION

PATENT NO. : 4,306,916

DATED : December 22, 1981

INVENTOR(S) : Donald L. Wollesen, William Meuli, Philip S. Shiota

It is certified that error appears in the above—identified patent and that said Letters Patent is hereby corrected as shown below:

Claim 5, Column 8, line 15, cancel the semicolon and insert a comma;

Claim 6, Column 8, line 52, cancel "purality" and insert --plurality--;

Claim 6, Column 8, line 61, cancel "purality" and insert --plurality--; and

Claim 7, Column 10, line 4, cancel "anstroms" and insert --angstroms--.

Signed and Sealed this

Twenty-second Day of June 1982

[SEAL]

Attest:

Attesting Officer

GERALD J. MOSSINGHOFF

Commissioner of Patents and Trademarks